United States Patent [19]
Chu

[11] Patent Number: 5,982,653
[45] Date of Patent: Nov. 9, 1999

[54] ADD-ON WITH INTERMIXED PIN CONNECTION

[75] Inventor: Tzu-Yih Chu, San Jose, Calif.

[73] Assignee: Ma Labs, Incorporated, San Jose, Calif.

[21] Appl. No.: 08/906,739

[22] Filed: Aug. 6, 1997

[51] Int. Cl.⁶ ........................................................ G11C 5/06
[52] U.S. Cl. .............................................. 365/63; 365/51
[58] Field of Search ................... 365/63, 51, 69, 365/72, 52; 439/330, 525

[56] References Cited

U.S. PATENT DOCUMENTS 5,557,564  9/1996  Haraguchi et al. ...................... 365/63
5,648,679  7/1997  Chillara et al. ......................... 257/666

FOREIGN PATENT DOCUMENTS 3123-620  1/1983  Germany ................................. 365/63

Primary Examiner—Tan T. Nguyen
Attorney, Agent, or Firm—Townsend and Townsend and Crew LLP

[57] ABSTRACT

A substrate with a number of memory chips in a standard arrangement. However, the traces for either or both of data and address lines are intermixed, such that, for example, D0 can be re-routed so that it need not connect to D0 on a particular memory chip. For an add-on card or module with the processor and SRAM on the same card, the connections between the processor pins and the SRAM pins can be intermixed. For a memory add-on card or module, the lines between the module connector and the memory chip pins can be intermixed. Since all of the bits get addressed in any event in each chip, it is transparent to the user that such a re-routing has occurred. Such a re-routing will simplify the trace layout significantly, eliminating required cross-overs.

7 Claims, 3 Drawing Sheets

ADD-ON WITH INTERMIXED PIN CONNECTION

BACKGROUND OF THE INVENTION

The present invention relates to single in-line memory modules (SIMMs) and dual in-line modules (DIMMs), and more particularly to the routing of traces on such modules.

SIMM and DIMM modules have gained enormous popularity, with most personal computers being shipped with sockets for such modules. This enables a user to later add additional modules increasing the memory capacity. There are also cache SRAM modules and the INTEL Klamath CPU (Pentium II) module with on-board SRAM.

Memory modules are made in many different sizes and capabilities, with the older 30-pin modules being replaced with 72-pin and 168-pin modules. The "pins" were original pins extending from the module's edge, but now most modules are leadless, having metal contact pads or leads. The modules contain a small printed-circuit board substrate, typically a multi-layer board with alternating laminated layers of fiberglass insulation and foil or metal interconnect layers. Surface mounted components are soldered onto one or both surfaces of the substrate.

The cache SRAM used in the Pentium motherboard is a level II cache. The planned Intel Klamath is meant to be the successor of the well-known Pentium Pro. The Klamath doesn't include any 2nd level cach, as its predecessor the Pentium Pro does. Instead, the 2nd level cache (256K or 512K) will be external to the Klamath and integrated onto a module (or slot card) with the Klamath processor. The 256K cache would be typically configured as 32K×64 bits, while the 512K cache would be configured as 64K×64 bits.

The older 30-pin modules typically had 8 data input/output (I/O) pins or leads. The new 168-pin modules have 64 data I/Os. In some configurations, the data I/Os are shared among multiple memory chips.

Increased numbers of pins and sizes of the memory chips has increased the difficulties of laying out the traces to connect to the memory module connector. Large numbers of "cross-unders" (alternately called "cross-overs") are required, wherein a trace is connected by a via to a second layer in the substrate so that it can cross under a trace which is in its way. For the new 168-pin module and 16 Meg SDRAM, manufacturers are producing a 6-layer circuit board substrate in order to accommodate the trace layout complexities. This significantly increases the cost of the memory module, offsetting the price advantage of the higher density DRAM. In addition, the large number of traces and the distances required affect timing and noise, and in particular can cause problems for timing-sensitive synchronous DRAMs (SDRAM).

The JEDEC standard for the memory modules attempts to address the optimum layout for assigning pins or contacts. For the 168-pin module, half of the data inputs are roughly grouped on the left side of the module, while the other half are grouped on the right side. In addition, chip designs take into consideration layout issues. For example, a 4 data bit chip will have bits D0 and D1 from top to bottom on the left side of the chip, while the right side will start with D3 at the top and have D2 at the bottom, thus enabling connecting via traces to four sequential data pins without requiring any cross-unders for that chip. However, as the number of data inputs per chip increases, and especially where multiple chips share these same data lines, cross-overs cannot be avoided.

SUMMARY OF THE INVENTION

The present invention provides a substrate with a number of memory chips in a standard arrangement. However, the traces for either or both of data and address lines are intermixed, such that, for example, D0 can be re-routed so that it need not connect to D0 on a particular memory chip. For an add-on card or module with the processor and SRAM on the same card, the connections between the processor pins and the SRAM pins can be intermixed. For a memory add-on card or module, the lines between the module connector and the memory chip pins can be intermixed. Since all of the bits get addressed in any event in each chip, it is transparent to the user that such a re-routing has occurred. Such a re-routing will simplify the trace layout significantly, eliminating required cross-overs.

Where chips are grouped with separate CAS lines for each group, the intermixing is restricted to within a single CAS group. Preferably, the intermixing is restricted to groups of 8 bits.

The present invention reduces the number of cross-overs, thus resulting in less cross talk and less noise. The traces are made shorter with less loading and faster timing. In addition, the reliability and flexibility of the memory module is increased. The reduction in loading and noise has enabled the elimination of damping resistors required in other module designs to reduce the noise level. The present invention has enabled a layout which would normally take six layers of a substrate to be accomplished with only four layers. Similarly, a four layer layout can be reduced to a two layer layout.

Not only data lines can be switched, but address lines can be switched as well. Since address lines are typically shared among all the chips, this may in some cases result in an even larger reduction in cross-overs. In some instances, certain address lines may be reserved for a command register, in which case these reserved address lines are not switched.

For a further understanding of the nature and advantages of the invention, reference should be made to the following description taken in conjunction with the accompanying drawings.

DESCRIPTION OF THE PREFERRED EMBODIMENT

Figure 1:
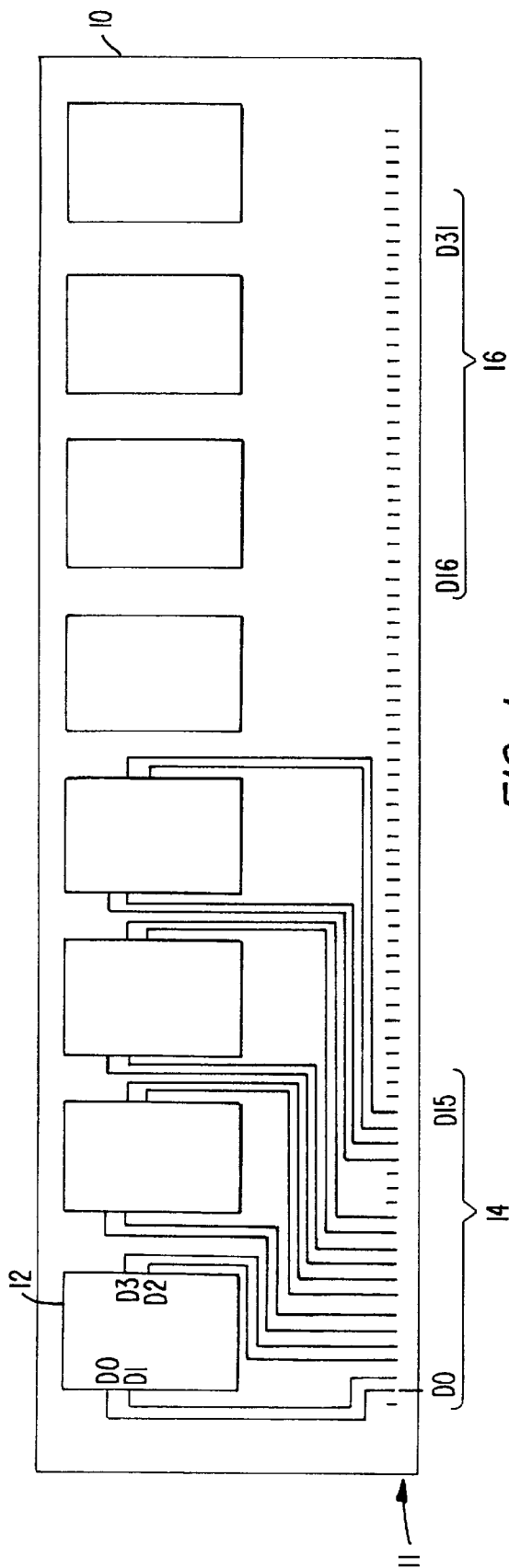
FIG. 1 is a diagram of a typical prior art memory module trace layout.

FIG. 1 illustrates a prior art DIMM 168-pin module 10 showing a first side of the module. The module includes 8 memory chips 12, shown as having 4 data I/Os D0–D2 each. The JEDEC pin assignment standards generally group the first 16 data bits in a portion 14 of a connector, while the last 16 are grouped in a portion 16. The sequential nature of the pin assignments along connector 11 allows connection in sequence to the data I/Os of chips 12 without a cross-over.

The chip design has the least significant bit toward the top of the chip on the left, while it is toward the bottom of the chip on the right, thus enabling the sequential connection of traces without a cross-over. However, due to the need for control lines, address lines, and other I/Os, a number of cross-overs are typically required. In addition, as the number of bits on the chip increase, or as multiple chips connect to the same data lines, increased number of connections and cross-overs are required.

Figure 2:
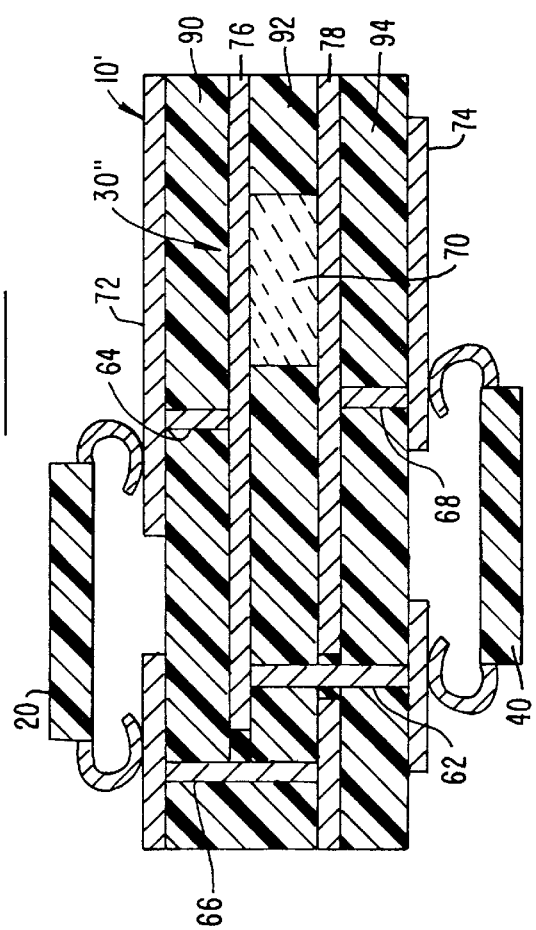
FIG. 2 is a diagram illustrating in cross-section a multiple-layer memory module substrate.

FIG. 2 is a cross-sectional diagram of an example of a multiple-layer substrate. Substrate 10' is a multi-layer printed-circuit board or other material having a laminate of insulting fiberglass layers 90, 92, 94 sandwiched between four metal layers 72, 74, 76, 78. Top metal layer 72 is on the top surface of substrate 10', while bottom metal layer 74 is on the bottom surface of substrate 10'.

Top metal layer 72 and bottom metal layer 74 are patterned to form traces for signal interconnect and bonding or soldering pads which are wide enough for soldering and bonding with the pins of DRAM chips. Interior metal layers 76, 78 are used for power and ground routing and are sometimes called the power and ground plane since these layers are often largely unpatterned sheets rather than small traces. Metal layer 76 is the power-supply layer while metal layer 78 is the ground layer.

The pins of DRAM chip 20 are soldered to top metal layer 72 while DRAM chip 40 has its pins soldered to bottom metal layer 74. Via 66 is formed to electrically connect the ground pin of DRAM chip 20 to ground metal layer 78 while via 64 is formed to electrically connect the power pin of DRAM chip 20 to power metal layer 76. Likewise, via 68 is formed to electrically connect the ground pin of DRAM chip 40 to ground metal layer 78 while via 62 is formed to electrically connect the power pin of DRAM chip 40 to power metal layer 76. Thus vias 62, 64, 66, 68 provide connecting from the power and ground pins of DRAM chips 20, 40 to power and ground metal layers 76, 78 which is connected to slug 70 which forms capacitor 30". Vias can also be connected to metal traces isolated in the ground or power layer, or additional layers can be added for these cross-unders.

Figure 3:
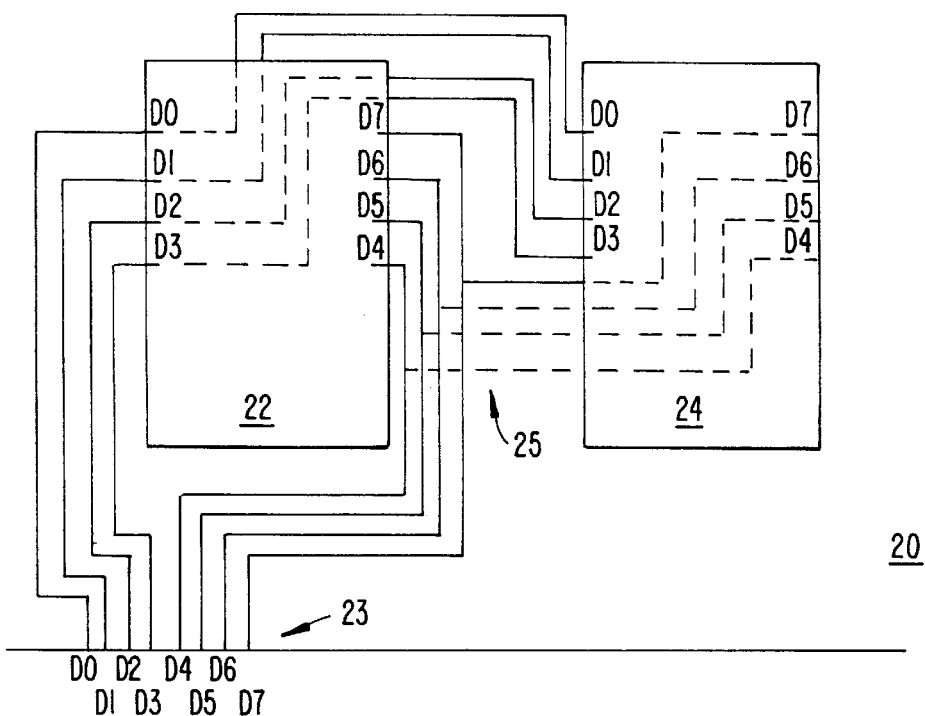
FIG. 3 is a diagram illustrating a prior trace layout for connecting two chips on a module.

FIG. 3 illustrates a portion of a module 20, showing only two chips 22 and 24 of the module. Also shown are only data I/O pins D0–D7 on a portion of connector 23. The metal traces are shown connecting from the data pins on connector 23 to the data pins on chips 22 and 24. As can be seen, the traces are connected to their correspondingly labeled pin, with D2 on connector 23 being connected to D2 on chip 22 and D2 on chip 24. In this arrangement, two chips are connected to the same data pins. A SIMM module with 8 chips might have its chips grouped into four groups of 8 bits each, or a DIMM might have each side grouped into four groups of 8 bits each.

As shown in FIG. 3, the traces are shown in solid where they appear on the top of the substrate, and are shown in phantom where they pass under a chip, or cross under to a lower layer. In particular, three cross-unders are shown in area 25 for the lines connecting bits D4, D5 and D6. This is simply one example of the complexities caused by the high density of today's high density memory modules.

Figure 4:
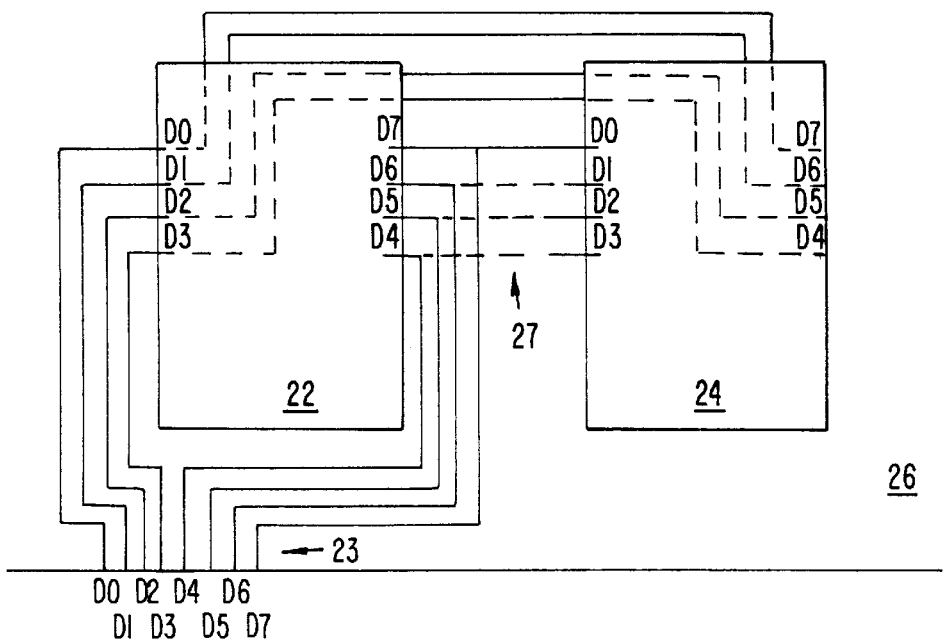
FIG. 4 is a diagram of an exemplary trace layout according to the present invention illustrating a switched trace connection which improves upon the layout of FIG. 3.

FIG. 4 illustrates one embodiment of a trace layout according to the present invention. Chips 22 and 24 are connected to a connector 23 as in FIG. 3. However, a substrate 26 with a different trace layout is used instead. As can be seen, while the first chip has its pins corresponding to the pins of connector 23, chip 24 does not have such correspondence. For example, bits D0–D3 are connected to bits D7–D4 of chip 24. Similarly, bits D4–D7 are connected to D3–D0 of chip 24. As can be seen, however, in area 27 the length of the traces compared to of FIG. 3 are reduced. The designer can chose whether to reduce cross-overs or reduce trace length, or some combination by intermixing.

Since all the bits of both chips will be addressed by different combinations of the bits appearing on D0–D7, it is irrelevant to the user that an actual bit position may be different in one chip compared to another chip. The only significance is a slight complication in debugging a memory module, since a debugger must know the different pin assignments at different chip positions.

One restriction on the switching of data traces is that they must stay within a group that is controlled by the same CAS line or same RAS line. In most systems used today, it is desirable to intermix only within 8 bit groupings. In one type of module, a CAS line is assigned to every 8 bits, while an RAS line is assigned to every 16 bits.

If every two CAS lines are tied together on the module, so that each 16 bits are controlled by the same CAS and RAS control lines, then intermixing could be done within 16 bits, for example. Thus, for the example of FIG. 4, data bits D0–D15 could be interchanged, but a trace within that group could not be interchanged with a trace within the group D16–D31.

Figure 5:
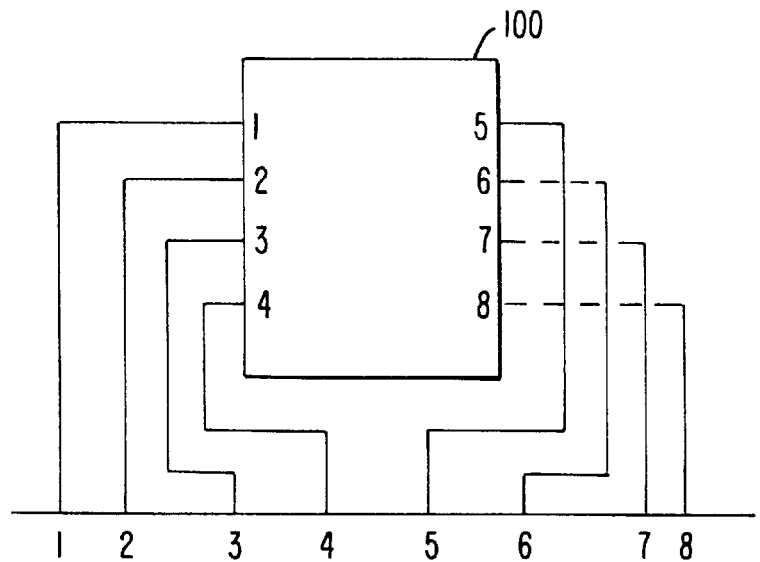
FIG. 5 is a diagram illustrating another prior art trace layout for connecting connector pins to a chip.
Figure 6:
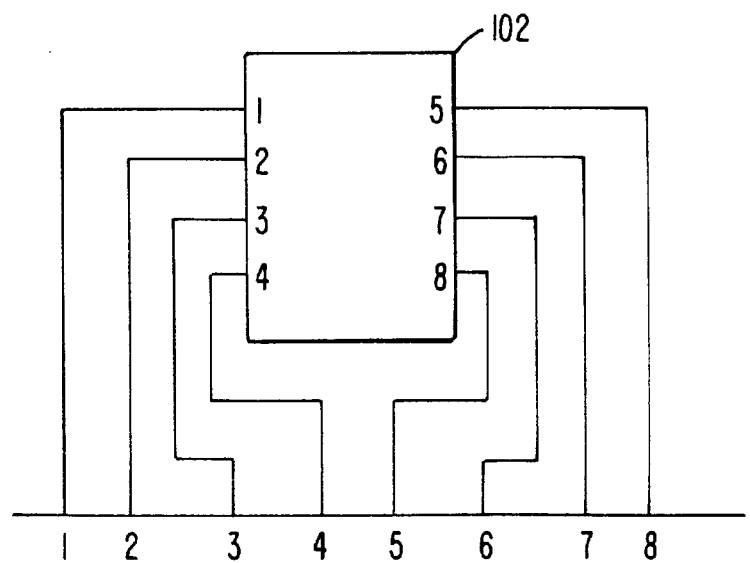
FIG. 6 is a diagram of an exemplary trace layout according to an embodiment of the present invention illustrating an intermixed trace layout which improves the layout of FIG. 5.

FIG. 5 shows an alternate prior art configuration with connectors 1–8 connected to pins 1–8 of a chip 100. As can be seen, multiple cross-overs are required. FIG. 6 is an example of a layout according to the present invention for connecting to a chip 102. As can be seen, by intermixing the connections to pins 5–8 of chip 102, the cross-overs are eliminated. Note that the intermixing is within an 8-bit group.

The present invention could also be applied to a processor card, such as one to be used for the Intel Klamath. That module has the processor and 4 SRAM chips on the same module. The SRAM chips in one embodiment are 32K×32. The data and address lines between the processor pins and the SRAM pins can be intermixed, within 8 bit data groups, to improve the routing. Byte groups of 8-bits should be retained, unless the control lines are also intermixed in the same way.

The present invention can also be applied to the address lines of a memory module. Typically, each address line is connected to all of the chips on a module. However, it generally does not matter which position is addressed in a particular chip, as long as they are all addressed. One exception is where certain addresses are designated for a certain purpose, such as for a command register. Such a command register may, for instance, indicate bits A0, A1 and A2 to designate the burst rate for the memory module.

The present invention can be applied to any type of memory or other device which has multiple data and address lines on a module. For example, the present invention could apply to memories such as DRAM, SDRAM, RDRAM, FPM-DRAM, EDO-DRAM, ROM, PROM, EPROM, or EEPROM.

The present invention has enabled a vastly simplified layout for a module substrate. In particular, designs for 64 data bit, 168-pin modules running 100 MHz SDRAM chips has enabled a 4-layer board to be used instead of a 6-layer board and has also allowed the elimination of damping resistors due to the reduced noise level from the layout of the present invention.

As will be understood by those of skill in the art, the present invention may be embodied in other specific forms without departing from the spirit or essential characteristics thereof.

For example, modules other than a SIMM or DIMM module could be used. Accordingly, the foregoing description is intended to be illustrative, but not limiting, of the scope of the invention which is set forth in the following claims.

What is claimed is:

1. A memory module comprising:

a substrate having a connector with a plurality of connector lines;

a plurality of memory chips mounted on said substrate, each memory chip having a plurality of data I/O connections;

said connector lines including at least two groups of data I/O lines, each of said data I/O lines connecting to at least two of said memory chips, said groups being assigned to different ones of said memory chips; and a plurality of traces connecting said two groups of data I/O lines to said data I/O connections of said memory chips, such that at least two of said I/O connector lines are reassigned to other than a sequentially corresponding memory chip data I/O connections;

whereby the need for at least one trace crossover is eliminated.

2. The memory module of claim 1 further comprising:

at least first and second CAS lines in said connector, each of said CAS lines corresponding to one of said groups of data I/O lines and to a portion of said memory chips; and wherein said I/O connector lines are reassigned within a group corresponding to one of said CAS lines.

3. The memory module of claim 1 wherein said connector lines include four groups of data I/O lines, and wherein the interior two groups include reassigned lines.

4. The memory module of claim 1 further comprising:

a plurality of address lines in said connector;

a plurality of address connections on each of said memory chips;

a plurality of traces coupling said address lines to said address connections, wherein at least one of said address lines connects to a non-sequentially corresponding address connection on at least one of said memory chips.

5. The memory module of claim 1 wherein said connector includes either pins or contacts connected to said connector lines.

6. The memory module of claim 1 wherein said memory chips are one of DRAM, SDRAM, EDO DRAM, RDRAM, ROM, PROM, EPROM, and EEPROM.

7. A memory module comprising:

a substrate having a connector with a plurality of connector lines;

a plurality of memory chips mounted on said substrate, each memory chip having a plurality of data I/O connections;

said connector lines including at least two groups of data I/O lines, said groups being assigned to different ones of said memory chips;

a plurality of traces connecting said two groups of data I/O lines to said data I/O connections of said memory chips, such that at least two of said I/O connector lines are reassigned to other than a sequentially corresponding memory chip data I/O connections;

whereby the need for at least one trace crossover is eliminated;

at least first and second CAS lines in said connector, each of said CAS lines corresponding to one of said groups of data I/O lines and to a portion of said memory chips;

wherein said I/O connector lines are reassigned within a group corresponding to one of said CAS lines;

wherein said connector includes either pins or contacts connected to said connector lines; and wherein said memory chips are one of DRAM, SDRAM, EDO DRAM, RDRAM, ROM, PROM, EPROM, and EEPROM.

* * * * *